United States Patent [19]

Loprest et al.

[11] 3,744,904

[45] July 10, 1973

[54] TRANSPARENT PHOTOGRAPHIC MASKS

[75] Inventors: Frank J. Loprest; Donald E. Barr, both of Binghamton, N.Y.

[73] Assignee: GAF Corporation, New York, N.Y.

[22] Filed: June 11, 1970

[21] Appl. No.: 45,590

[52] U.S. Cl. ...................... 355/125, 95/1 R, 96/36.2

[51] Int. Cl. ............................................ G03b 27/28

[58] Field of Search ....................... 355/125; 95/1 R; 96/36.2, 38.3

[56] References Cited

UNITED STATES PATENTS

| | | | |
|---|---|---|---|
| 3,592,649 | 7/1971 | Parsonage et al. | 96/36.2 X |
| 3,510,371 | 5/1970 | Frankson | 96/36.2 X |
| 3,542,612 | 11/1970 | Cashau et al. | 96/36.2 X |

*Primary Examiner*—Richard L. Moses

*Attorney*—Walter C. Kehm, Samson B. Leavitt, Homer J. Bridger and Martin A. Levitin

[57] ABSTRACT

Photographic masks, suitable for reproduction in a photo-resist layer — by exposure of the latter to actinic light under the mask, and development of the photo-resist image — of the pattern of a microelectronic component or device, are made by exposure to light in accordance with an original (especially by contact exposure under a primary mask) containing the pattern to be reproduced, of light-sensitive material having a flat, rigid, dimensionally stable transparent base such as glass and a thin (e. g. 0.5 to 10 micron thick) transparent resin layer adhering to the base and containing, molecularly dispersed therein an azo coupling component and a light-sensitive diazonium compound, susceptible to decomposition on exposure to light and temporarily stabilized against coupling pending alkaline development, the diazonium compound and coupling component being uniformly distributed throughout the thickness of the resin layer, said light-sensitive material yielding on development with ammonia vapor, in the unexposed areas, an azo dye coloration transparent to visible light but opaque to ultraviolet light, while the decomposition products of the diazonium compound and azo coupling component in the light-exposed areas are transparent to ultraviolet as well as visible light. The light-sensitive materials are made by applying the sensitizing composition and resin to the base in the form of a solution in a volatile solvent, removing any excess e. g., by centrifugation, and drying to remove the solvent. The masks produced afford satisfactory resolution to 0.1 micron. They are used to reproduce the pattern in a photo-resist layer coated on a substrate such as a silicon wafer, as by contact exposure under the mask, development of the photo-resist, and suitable modifying treatment of the thereby exposed areas of the underlying substrate.

9 Claims, No Drawings

TRANSPARENT PHOTOGRAPHIC MASKS

This invention relates to transparent photographic masks for use in the manufacture of microelectronic components and devices, to light-sensitive plates for making such masks, to processes for making such light-sensitive plates and photographic masks, and to use of the masks in the manufacture of such components and devices.

Microelectronic components and devices are currently manufactured by light-exposure of a photo-resist coating on a suitable substrate (e. g., an $SiO_2$-coated Si wafer) under a photographic mask wherein the desired circuit elements or pattern is recorded in an image-bearing layer. The photo-resist is developed to remove portions thereof in accordance with the pattern, and the thereby exposed areas of the underlying substrate are treated to modify its characteristics. For example, the $SiO_2$ coating can be removed from the exposed areas by etching with $H_2F_2$, and the Si surface modified with P, As, Sb, or by deposition of a metal film. A series of patterns may be successively reproduced on the substrate, in each case applying a new photo-resist coating, exposing under an appropriate mask in register with the preceding exposures, developing the photo-resist, and subjecting the exposed areas of the substrate to the desired treatment.

Conventionally, photographic masks used in the foregoing process are made with silver halide-gelatin sensitized materials — yielding by conventional development, a mask having a silver image in a gelatin layer. The desired micro-pattern is usually produced on the mask from a large size original, made by drafting methods and reduced by optical projection to the desired size (e.g., a square of the order of 0.1 inch on a side). The micro-pattern is usually reproduced repeatedly on the mask on adjacent areas in the form of a grid (e.g., 3 – 4 cm. square) which is then printed in the photo-resist layer on a substrate surface. After completing development and treatment of the underlying substrate surface for each photo-resist of the series, the substrate is severed along the lines of the grid to yeild a series of chips each bearing the desired components or devices for use in a microelectronic product.

Silver halide-gelatin sensitized materials have a number of desirable properties for production of transparent photographic masks for the above described application. Thus, they readily yield sharp contrast between opaque silver image areas and surrounding transparent regions. They possess high speed response to light exposure, and are susceptible to rapid development. They are convenient for purposes of optical reduction, and for successive reproduction of the same micro-pattern on adjacent areas of a grid (so-called "step-and-repeat" exposure). However, silver halide materials are also subject to serious disadvantages in the above described manufacture of micro-electronic components and devices.

Thus, exposure to light under a mask of a photo-resist layer on a substrate is ordinarily carried out by contact printing wherein the imaged gelatin layer of the mask is held in pressure contact with the coated substrate. Gelatin is not reliably durable for this purpose, and is often marred in the contacting process by scratching, abrasion, lateral movement of the contacting surfaces and by pressure contact with minute projections on the substrate surface causing so-called "star-cracking" defects and the like. To prolong the useful life of such masks, it is customary to prepare a "primary" mask with a silver image in a gelatin layer of the desired dimensions, which is used for preparation of "working" masks by contact printing on silver halide-gelatin sensitized material. The "primary" mask is not used for contact printing of the photo-resist coated substrate, but instead, the "working" masks are used for this purpose. Should these be injured, they can be readily replaced.

Moreover, silver halide-gelatin materials are inherently limited in degree of resolution, because of the granular nature of the emulsion. Loss of resolution is compounded in preparing the "working" silver halide mask from the primary mask. The degree of resolution is subject to further deterioration by the extensive aqueous processing steps involved in development and fixing, which cause swelling of the gelatin layer and consequent distortion of the image, as well as introduction of particulate impurities in the gelatin layer. Particulate impurities in the emulsion also constitute a serious cause of defects, and such impurities cannot be removed by filtration because of the insoluble character of the silver halide suspended in the emulsion. When used for exposure of positive-working photo-resists, the background areas of the mask are normally constituted by opaque silver image areas, rendering visual alignment and register of the mask with preceding exposures extremely difficult. In addition, silver halide latent images are subject to fading and must therefore be processed soon after they are produced.

In an attempt to overcome the difficulties resulting from lack of durability of the gelatin surface of "working" masks, it has been proposed to substitute masks formed by deposition of a chromium or other metal film on glass, coating with a photo-resist, exposing under a "primary" mark, developing the photo-resist, and etching away the thereby exposed areas of the chromium film. While the resulting masks are relatively durable, they suffer from defects involving lack of edge sharpness and image degradation as a result of light scattering in the photo-resist layer and of undercutting in the etching process. The highly reflecting character of the Cr surface also tends to impair resolution.

It is an object of this invention to provide a novel light-sensitive material for the production of photographic masks--especially "working" masks--for the purposes above described, a process for the production of such materials, and masks prepared therewith suitable for contact exposure of photo-resist-coated substrates in the production of microelectronic components and devices, and a process for using such masks in the production of such components and devices, which avoid one or more of the aforesaid difficulties encountered with gelatin-silver halide materials and vapor-deposited chromium or other metal masks.

More specifically, it is an object of this invention to provide photographic masks for the aforesaid purpose in which the image areas—especially those covering the major portion of the area of the mask—although apaque to ultraviolet light, are transparent (as are the remaining areas) to visible light. As a result, register and alignment of masks in successive exposures of the same substrate are greatly facilitated.

Further, it is an object of this invention to provide a process for making sensitized materials for the aforesaid purpose, in which all components of the sensitizing composition are in solution, so that any particulate impurities can be removed by filtration through microporous filter media, such that the sensitizing composition is substantially freed of such impurities.

Also, it is an object to provide light-sensitive materials for such masks in which the image-forming components and the image formed therefrom on development are molecularly dispersed in the resin vehicle—avoiding any such defects as result from the granular character of silver halide emulsions.

Further, it is an object to provide light-sensitive materials requiring no etching in their development for production of a "working" mask, whereby undercutting and light-scattering—such as are encountered in connection with vapor-deposited chromium 10:1 are entirely avoided.

It is also an object of this invention to provide light-sensitive materials for preparation of photographic masks example, 0.5 the above described purpose in which processing for development has no tendency to cause swelling or otherwise to deform the photographic image, or to introduce particulate impurities.

Moreover, it is an object of the invention to provide a photographic mask capable of providing excellent resolution of lines of 1.0 micron in width, and satisfactory resolution of lines as narrow as 0.1 micron in width.

In accordance with this invention, light-sensitive materials capable of accomplishing the foregoing objectives in the preparation of photographic masks for the production of microelectronic components and devices are prepared by applying to a surface of a flat, rigid, dimensionally stable transparent base—especially a precision-surfaced glass plate—a thin uniform layer of a volatile, preferably organic, solvent solution of a resin adapted to form an adherent transparent film upon evaporation of the solvent, having also dissolved therein a photo-sensitizing composition comprising an azo coupling component and a light-sensitive diazonium compound susceptible to decomposition on exposure to actinic light, said composition being temporarily stabilized against coupling pending development by treatment with an alkaline developer, said photo-sensitizing composition yielding a molecular dispersion of its components in the resin upon evaporation of the solvent from the layer. The quantity of solution is limited so as to provide a layer of uniform thickness—e.g., by spraying, roller application or preferably, by applying an excess of the solution and centrifugal removal of the excess by spinning, such that upon evaporation of the solvent, the thickness of the residual layer is 0.5–10 microns. Advantageously, for this purpose, the solvent solution contains 5–50 percent and preferably, 25–40 percent by weight of non-volatile solids i.e., sensitizing composition and resin. In order to provide adequate image density, the quantity of azo coupler and diazonium compound should amount to at least about 10 percent, and preferably 30–90 percent by weight of the non-volatile components of the solution. Thus, appropriately, the weight ratio of sensitizing components (coupler and diazonium compound) to the remaining non-volatile components of the sensitizing composition (resin, stabilizers, etc.) may range appropriately from about 10L1 to about 1:7—the preferred range being 2:1 to 1:2.

The preferred method of applying the sensitizing solution to the base involves, for exaple, placing about 0.5 to 3 ml. of the solution on the surface of the base—e.g., a glass plate of a size up to about 5 inches square—and spinning the same in a horizontal position e.g., at 2,000–10,000 RPM for about 5 seconds or more, to remove excess solution and provide a thin layer thereof of the desired uniform thickness. Alternatively, the solution may be applied by spraying, using, for example, a fine spray nozzle heated to a temperature of about 50°–150° C. The volatile solvent is then removed by evaporation e.g., by drying in vacuum, air or inert gas or the like.

Numerous types of resins can be used as the binder or vehicle for the sensitizing compositions of this invention. Operative resins are specifically those which are soluble in the volatile solvents which also dissolve the diazonium compound and the azo coupler, and which yield an adherent transparent film of the non-volatile components of the solution upon evaporation of the solvent--usually of amorphous (non-crystalline) character. Thus, they include but are not limited to lower hydroxy-alkyl celluloses, cellulose esters of lower aliphatic carboxy acids, keton polymers such as condensation polymers of HCHO and cyclohexanone or methyl ethyl ketone, polyvinyl acetate, polymers of lower alkyl esters of acrylic and methacrylic acid, polyesters from glycols and phthalic acids and thermoplastic polyamide resins, and mixtures thereof. It is to be understood that any other resin or mixture of resins, natural or synthetic, organic or inorganic, having the aforesaid solubility and film forming characteristics can be similarly employed, including thermoplastic, and cross-linking or other types of thermosetting resins. Suitable volatile solvents are those which dissolve the azo coupling component and diazonium compound as well as the resin employed, and which are inert toward the components of the sensitizing composition. They include especially one or more of the following organic solvents: methanol, ethanol, 2-methoxyethanol, ethylene glycol, aceton, gamma-butyrolactone, dioxane, N-methylpyrrolidone, and the like. Water may be employed as solvent with water soluble components (sensitizing dye components, resin binder, etc.). In characterizing as "lower", the hydroxyalkyl groups of cellulose ethers, the aliphatic carboxy acid radicals of cellulose esters, the esterifying alkyl groups of acrylic and methacrylic esters, and similar aliphatic radicals referred to herein, it is intended to signify that they contain one to four carbon atoms. The resin should also of course be compatible and non-reactive with the sensitizing dye components except when the resin is one of said components.

Sensitizing components suitable for the sensitizing compositions of the present invention include azo coupling components and light-sensitive diazonium compounds, temporarily stabilized against coupling, pending exposure to an alkaline developing treatment, as conventionally used in diazotype materials, e.g., the diazonium compounds and azo couplers disclosed in U. S. Pat. No. 2.772,974 and the diazonium compounds disclosed in U. S. Pat. No. 3,164,469. It is further required that the sensitizing components be soluble in the volatile solvent employed as the vehicle for application of the sensitizing coating, and that they yield a molecular dispersion, non-crystalline in character, in the resin layer remaining as a residue when the solvent is evaporated. Within these limits, they include most light-sensitive diazonium compounds and azo coupling components hitherto used in diazotype materials, and no claim is herein made thereto per se, but only when employed in accordance with the present invention. The diazonium compounds are preferably p-tertiary-aminobenzene diazonium salts wherein the benzene nucleus can be further substituted—especially in the 2- and/or 5-position—e.g., by lower alkyl groups, lower alkoxy groups, halogen (Cl, Br, I, F), or by a trifluoromethyl group. The tertiary amino group preferably contains as substituents, lower alkyl groups, or the elements forming with the amino nitrogen, a 5- or 6-membered heterocyclic ring such as piperidine, pyrrolidine, morpholine, etc. As salt-forming radicals for the diazonium group, a hexafluoroarsenate or fluorborate radical is especially suitable by reason of their solubility in the volatile, preferably organic, solvents employed for the sensitizing compositions. The latter compositions may of course contain minor amounts of other assistants and additives such as wetting agents, plasticizers, stabilizers, etc.

As a base to which the sensitizing compositions are applied, a clear glass plate is preferably used, ranging in size, for example, from about 2 × 2 inches to about 4 × 5 inches and from about 0.05 to 0.15 inch thick. Such plates are adequately transparent, rigid and dimensionally stable. The surface to which the sensitizing composition is applied should be flat—i.e., should not deviate from a fixed plane by more than about 0.001 inch per linear inch of the plane. Said surface may if desired be provided, prior to application of the sensitizing layer, with a thin smooth, flat layer of resin or other subbing material to promote adherence, flatness, light absorption properties and the like. Somewhat greater deviations may be tolerated in the surface opposite that to which the sensitizing composition is applied. While glass plates are preferred, other transparent, rigid, dimensionally stable materials with similarly flat surfaces can be used, such as hard clear synthetic resins, plastics, quartz or other inorganic materials, e.g., a single crystal of $CaF_2$.

After application of the light-sensitive layer to the surface of the base, and removal of the volatile solvent by evaporation, the durability or wear-resistance of the surface can be enhanced by application thereon of a thin coating of a tough, wear-resistant resin—especially, a protective layer having a thickness of 0.1 to 5.0 microns. This can be suitably accomplished by coating with a solution of the resin (or of materials adapted to form a resin of the desired character, such as an isocyanate prepolymer), removing the excess solution by spinning as in the case of the sensitizing composition, and evaporating the solvent. Suitable resins for this purpose are, for example, oil-modified polyurethanes and mixtures of ricinoleate polyester diisocyanate prepolymers with polyol hardeners, in an aromatic hydrocarbon solvent such as toluene or xylene.

In use, the sensitized plates of the invention are exposed to actinic light—preferably by contact exposure—under a "primary" mask bearing therein the desired pattern (e.g., as a photographic silver image) of a microelectronic component or device to be reproduced on the surface of a suitable microelectronic substrate. The plate is then developed by exposure to ammonia vapor. The latter may be moist or anhydrous, and may if desired be applied at superatmospheric pressure to accelerate development. Excess ammonia can be removed by flushing with air, nitrogen or other inert gas or the like.

The azo dye image produced on development as above in the sensitized plates of this invention is formed in the areas shielded from actinic light by the "primary" mask image. Said azo dye image is substantially opaque (i.e., possesses an optical density in excess of 0.5) to ultraviolet light of the wave length range to which the photo-resist with which the mask is to be used is sensitive. For most photo-resist coating, such ultraviolet light has its peak wavelength from about 390 to 458 millimicrons. The light-exposed areas of the mask—containing the photodecomposition products of the diazonium compound and azo coupling component, with any stabilizer employed, are transparent to visible light, and also sufficiently transparent to ultraviolet light in the range of 390 to 458 millimicrons so as to provide a ratio of the optical densities in the dyed and light-exposed areas of greater than about 5:1. The azo dye image areas--unlike the opaque silver images produced in a silver halide-gelatin layers—are colored, but transparent to visible light, such that visual inspection can be used to bring the mask into register with previous exposures of the microelectronic substrate. By appropriate selection of the azo coupling component employed in the sensitizing composition, a variety of image colors can be produced in various masks, serving as a color code for determining the order in which they are successively used, or to provide a specific color facilitating visibility and handling under certain ambient light conditions.

The fact that all components of the sensitizing composition as well as components of the solution used to provide the protective surface layer are soluble in the vehicle employed as a solvent permits removal of any particulate impurities by filtration through microporous filtration media. Molecular disperson of the sensitizing composition and of the azo dye image formed on development in the resin vehicle avoids limitation of degree of resolution such as in encountered by reason of the granularity of silver halide-gelatin emulsions. The absence of any liquid treatment in processing for development avoids any distortion such as that encountered in aqueous development and fixing of silver halide-gelatin materials.

Masks produced in accordance with dispersion invention afford satisfactory resolution of lines constituting the azo dye image or non-azo dye image areas having a width down to 0.1 micron, and excellent resolution at widths of 1.0 micron and above. Thus, they are suitable for reproduction of lines—whether constituted by the azo dye image or non-azo dye image areas—as narrow as 0.1 micron.

The resins employed as vehicles for the sensitizing compositions of this invention, as well as in the protective coating therefor, and methods for their production, are well known and no claim is herein made thereto per se, but only when employed in accordance with the teachings of this invention. They are far more tough, durable and wear-resistant than the gelatin serving as a vehicle for silver halide-sensitized materials. They are therefore not subject to defects such as "star-cracking," scratching, abrasion, and the like, when employed for contact printing under pressure upon a substrate of the type used for microelectronic components or devices. Since no etching process is used in forming the image of the mask, no defects such as those resulting from use of etching processes upon vapor-deposited chromium can occur. Similarly, the absence of any reflecting power in the azo dye image avoids distortion such as results from the reflective character of the Cr layer in a Cr mask.

Photo-resists employed on a substrate such as an $SiO_2$- coated Si wafer for production of a microelectronic component or device, can be positive- or negative-working. These photo-resists, and methods for their production, are well known and no claim is herein made thereto per se, but only when employed in accordance with the present invention. In positive-working resists, the light -exposed areas are rendered removable by appropriate solvent treatment, leaving the unexposed areas adhering as a protective layer on the substrate. Such photo-resists are disclosed, for example, in U. S. Pat. Application Ser. No. 799,998 of Feb. 17, 1969 (Deutsch et al.) and in U. S. Pat. Nos. 2,772,972 and 3,471,289, wherein the sensitizer is a diazo oxide, especially of the type disclosed in U. S. Pat. No. 2,797,213. The pattern of the microelectronic component or device to be reproduced upon the photo-resist-coated substrate, as recorded in a mask in accordance with this invention usually comprises narrow transparent areas or lines, surrounded by relatively extensive areas constituted by the azo dye image which are opaque to ultraviolet light--especially have a peak intensity from 390 to 458 millimicrons in wave length—to which most photo-resists are sensitive. Since the azo dye image areas of our mask are transparent to visible light, their register with previous exposures can be ascertained by visual inspection—not possible with masks having a photographic silver image—especially when positive-working photo-resists are employed.

Development of the positive-working photo-resists of the above cited references after exposure under a mask in accordance with this invention involves treatment with an aqueous alkaline developer e.g., aqueous ethanolamine, Na silicate or trisodium phosphate. The thereby exposed areas of the underlying substrate can then be modified by further treatment—e.g., etching of exposed areas of an $SiO_2$ coating with $H_2F_2$ or of an exposed metal film with HCl, $HNO_3$, aqua regia or the like, or treatment of an exposed Si surface with P, As, Sb, etc. Finally, the residual photo-resist can be removed with an appropriate organic solvent, such as methylethylketone, acetone, ethyl acetate, toluene, or the like. A new photo-resist layer can then be applied, and after contact printing as before under a mask in accordance with this invention, developed and processed as desired.

Obviously, negative-working resists can also be employed, such as those containing light-sensitive cinnamoyl compounds, disclosed in U. S. Pat. Nos. 3,493,380 and 3,497,356 or photo-sensitive phenol-formaldehyde resins of U. S. Pat. No. 3,409,487. In such cases, the light-exposed areas become insolubilized, and the photographic mask employed for printing a pattern upon the photo-resist layer is a reverse or "negative" of the azo dye image in masks of this invention employed with a positive-working photo-resist.

Our invention will be more fully understood from the following examples which are only illustrative and not limitative. All proportions, parts and percentages referred to herein and the appended claims are by weight, and similarly temperatures are in degrees Centigrade, unless otherwise indicated.

EXAMPLE 1

The following formulation was employed for the preparation of high resolution transparent photographic masks:

| | % |
|---|---|
| Hydroxypropyl cellulose, M.W. 75,000–275,000, ("Klucel J") | 2.3 |
| 2-methoxyethanol | 28.4 |
| methanol | 51.5 |
| acetone | 9.8 |
| m-hydroxyphenylurea | 1.9 |
| 4,4'-diresorcyl sulfide | 0.5 |
| 4-(N-pyrrolidinyl)-m-toluene-diazonium hexafluoroarsenate | 5.6 |

The resulting clear solution was coated upon glass plates having dimensions 2 × 2 inches, 2 1/2 × 1 1/2 inches, 3 × 3 inches, 3 1/2 433 3 1/2 inches and 4 × 5 inches, by applying 0.85 to 3.0 ml. of the solution, and spinning at 6,000 RPM for 20 seconds on a Headway spinner. The plates were air-dried for 5 hours or more in a clear bench, yielding a sensitized resin layer of uniform thickness of 1.1 micron. The resulting plates can be handled under the same yellow safe-light employed for photo-resists. The masks were patterned by ultraviolet exposure of 4,100 microwatts for 45 seconds under a "primary" mask containing a photographic silver image of a microelectronic component or device to be reproduced, and developed for 1–2 minutes by exposure to anhydrous ammonia. Excess ammonia was flushed with dry nitrogen. The unexposed regions of the plates containing an azo dye image were transparent to visible light and sepia in color, but opaque to and stable against ultraviolet light, having an optical density above 2.0 at wave lengths from 400 to 458 millimicrons. The light-exposed regions are transparent to visible and ultraviolet light, having an optical density less than 0.12 at a wave length range of 400 to 458 millimicrons. The resulting photographic mask was used to reproduce its image upon a Si wafer coated with a positive working photo-resist of the kind described in Example 1 of Ser. No. 799,998 cited above. An underlying $SiO_2$ coating was etched in the exposed areas, after aqueous alkaline development of the photo-resist layer, by treatment with buffered $H_2F_2$. By the above procedure, excellent resolution of one micron lines, and satisfactory resolution of lines as narrow as 0.1 micron, are obtainable.

EXAMPLES 2–21

The procedure of Example 1 was repeated, substituting the following formulations for the sensitizing solution. The results were substantially the same as those indicated in the preceding example, except for the indicated variation in image coloration:

FORMULATION 2

| | |
|---|---|
| Hydroxpropyl cellulose ("Klucel J") | 2.28% |
| HCHO-cyclohexanone condensation polymer, M.W. 500–1000 (Mohawk MR-85) | 0.76 |
| 2-methoxyethanol | 35.88 |
| methanol | 37.6 |
| acetone | 12.8 |
| m-hydroxypenylurea | 2.5 |
| 4,4'-diresorcyl sulfide | 0.76 |
| 4-(N-pyrrolidinyl)-m-toluene diazonium hexafluoroarsenate | 7.42 |

Image color: transparent sepia

FORMULATION 3

| | |
|---|---|
| HCHO-cyclohexanone condensation polymer (Mohawk MR-85) | 3.10% |

| | |
|---|---|
| 2-methoxyethanol | 35.1 |
| methanol | 36.86 |
| acetone | 12.76 |
| m-hydroxyphenylurea | 0.65 |
| 4,4'-diresorcyl sulfoxide | 4.46 |
| 4-(N-pyrrolidinyl)-m-toluene-diazonium hexafluoroarsenate | 7.27 |

Image color: transparent sepia

FORMULATION 4

| | |
|---|---|
| HCHO-cyclohexanone condensation polymer (Mohawk MR-85) | 2.01% |
| 2-methoxyethanol | 38.1 |
| ethylene glycol | 38.1 |
| methanol | 11.7 |
| acetone | 3.48 |
| m-hydroxphenylurea | 1.61 |
| 4,4'-diresorcyl sulfide | 0.29 |
| 4-(N-pyrrolidinyl)-m-toluene-diazonium hexafluoroarsenate | 4.71 |

Image color: transparent sepia

FORMULATION 5

| | |
|---|---|
| Cellulose acetate-butyrate | 3.17% |
| 2-methoxyethanol | 34.9 |
| methanol | 37.2 |
| acetone | 12.4 |
| m-hydroxyphenylurea | 0.65 |
| 4,4'-diresorcyl sulfoxide | 4.43 |
| 4-(N-pyrrolidinyl)-m-toluene-diazonium hexafluoroarsenate | 7.25 |

Image color: transparent sepia

FORMULATION 6

| | |
|---|---|
| Polyvinyl acetate, viscosity 0.68 by ASTM D-1343-54T ("Vinylite AYAT") | 3.17% |
| 2-methoxyethanol | 34.9 |
| methanol | 37.2 |
| acetone | 12.4 |
| m-hydroxyphenylurea | 0.65 |
| 4,4'-direscorcyl sulfoxide | 4.43 |
| 4-(N-pyrrolidinyl)-m-toluene-diazonium hexafluoroarsenate | 7.25 |

Image color: transparent sepia

FORMULATION 7

| | |
|---|---|
| $C_{1-4}$ alkyl acrylate-methacrylate copolymer ("Acryloid-B-72") | 3.17%0 |
| 2-methoxyethanol | 34.9 |
| methanol | 37.2 |
| acetone | 12.4 |
| m-hydroxphenylurea | 0.65 |
| 4,4'-diresorcyl sulfoxide | 4.43 |
| 4-(N-pyrrolidinyl)-m-toluene-diazonium hexafluoroarsenate | 7.25 |

Image color: transparent sepia

FORMULATION 8

| | |
|---|---|
| HCHO-methylethylketone condensation polymer, M.W. 500–1000 (Mohawk MR-74) | 3.17% |
| 2-methoxyethanol | 34.9 |
| methanol | 37.2 |
| acetone | 12.4 |
| m-hydroxyphenylurea | 0.65 |
| 4,4'-diresorcyl sulfoxide | 4.43 |
| 4-(N-pyrrolidinyl)-m-toluene-diazonium hexafluoroarsenate | 7.25 |

Image color: transparent sepia

FORMULATION 9

| | |
|---|---|
| Water-soluble acrylic acid-ethylacrylate copolymer, acid number 60-65, M.W. 3500–4500 | 2.74% |
| methanol | 34.8 |
| acetone | 34.8 |
| m-hydroxyphenylurea | 6.77 |
| 4,4'-diresorcyl sulfide | 1.24 |
| 4-(N-pyrrolidinyl)-m-toluene-diazonium hexafluoroarseante | 19.65 |

Image color: transparent sepia

FORMULATION 10

| | |
|---|---|
| Phenol-formaldehyde resin (" Amberol St-137X") | 2.74% |
| methanol | 34.8 |
| acetone | 34.8 |
| m-hydroxyphenylurea | 6.77 |
| 4,4'-diresorcyl sulfide | 1.24 |
| 4-(N-pyrrolidinyl)-m-toluene-diazonium hexafluoroarsenate | 19.75 |

Image color: transparent sepia

FORMULATION 11

| | |
|---|---|
| α-Methyl-substituted Nylon 66, Melting Temp. 115°C. (Kirk-Othmer, "Encyclopedia of Chemical Technology," 2nd Ed., Vol. 16. p. 18) | 2.74% |
| methanol | 34.8 |
| acetone | 34.8 |
| m-hydroxphenylurea | 6.77 |
| 4,4'-diresorcyl sulfide | 1.24 |
| 4-(N-pyrrolidinyl)-m-toluene-diazonium hexafluoroarsenate | 19.65 |

Image color: transparent sepia

FORMULATION 12

| | |
|---|---|
| 30% Aqueous solution of copolymer of Formulation 9 | 2.74% |
| methanol | 34.8 |
| acetone | 34.8 |
| m-hydroxyphenylurea | 6.77 |
| 4,4'-diresorcyl sulfide | 1.24 |
| 4-(N-pyrrolidinyl)-m-toluene-dizaonium hexafluoroarsenate | 19.65 |

Image color: transparent sepia

FORMULATION 13

| | |
|---|---|
| HCHO-cyclohexanone condensation polymer (Mohawk Mr-85) | 6.68% |
| methanol | 40.85 |
| acetone | 40.85 |
| 2-methyl-resorcinol | 7.93 |
| 4-(N-pyrrolidinyl)-m-toluene-diazonium hexafluoroarsenate | 3.79 |

Image color: light sepia, transparent

FORMULATION 14

| | |
|---|---|
| HCHO-cyclohexanone condensation polymer (Mohawk MR-85) | 6.28% |
| methanol | 40.3 |
| acetone | 40.3 |
| o-acetoacetotoluidide | 5.46 |
| 4-(N-pyrrolidinyl)-m-toluene-diazonium hexafluoroarsenate | 7.66 |

Image color: transparent light sepia

FORMULATION 15

| | |
|---|---|
| HCHO-cyclohexanone condensation polymer (Mohawk MR-85) | 6.5% |
| methanol | 40.2 |
| acetone | 40.2 |
| N-(β-hydroxyethyl)-α-resorcylamide | 9.26 |
| 4-(N-pyrrolidinyl)-m-toluene-diazonium hexafluoroarsenate | 3.84 |

Image color: transparent red

FORMULATION 16

| | |
|---|---|
| HCHO-cyclohexanone condensation polymer (Mohawk MR-85) | 6.82% |
| methanol | 38.5 |
| acetone | 38.5 |
| β-hydroxynaphthoic acid toluidide | 12.22 |
| 4-(N-pyrrolidinyl)-m-toluene-diazonium hexafluoroarsenate | 3.96 |

Image color: transparent blue

FORMULATION 17

| | |
|---|---|
| Phenol-formaldehyde resin ("Amberol ST-137X") | 27.4% |
| 2-methoxyethanol | 26.5 |
| acetone | 43.4 |
| 4-(N-pyrrolidinyl)-m-toluene-diazonium hexafluoroarsenate | 2.7 |

Image color: transparent dark sepia. In this case, the Phenol-formaldehyde resin serves as the azo coupling component.

FORMULATION 18

| | |
|---|---|
| Polyethylene orthophthalate ester resin | 26.7% |
| hexamethoxymethylmelamine ("Cymel 300") | 6.5 |
| acetone | 27.2 |
| methanol | 27.2 |

| | |
|---|---|
| p-toluenesulfonic acid | 6.5 |
| m-hydroxyphenylurea | 1.7 |
| 4-(N-pyrrolidinyl)-m-toulene-diazonium hexafluoroarsenate | 4.1 |
| Image color: transparent dark sepia | |

FORMULATION 19

| | |
|---|---|
| HCHO-cyclohexanone condensation polymer (Mohawk MR-85) | 8.6% |
| methanol | 37.6 |
| acetone | 37.6 |
| m-hydroxyphenylurea | 4.7 |
| 4-(N-pyrrolidinyl)-m-toluene-diazonium hexafluoroarsenate | 11.4 |
| Image color: transparent sepia | |

FORMULATION 20

| | |
|---|---|
| Polyethylene orthophthalate ester resin | 17.3% |
| hexamethoxymethylmelanine (cross-linking agent) | 4.2 |
| dioxane | 29.1 |
| gamma-butyrolactone | 31.9 |
| p-toluenesulfonic acid | 4.2 |
| m-hydroxyphenylurea | 3.2 |
| N-β-hydroxyethyl resorcylamide | 4.2 |
| p-morpholinobenzene-diazonium fluoborate | 5.9 |
| Image color: transparent red | |

FORMULATION 21

| | |
|---|---|
| Polyethylene terephthalate ester resin | 17.4% |
| hexamethoxymethylmelamine | 4.2 |
| dioxane | 28.9 |
| gamma-butyrolactone | 31.7 |
| ethanol | 1.4 |
| p-toluenesulfonic acid | 4.2 |
| m-hydroxyphenylurea | 6.4 |
| p-morpholinobenzene-diazonium fluoborate | 5.8 |
| Image color: transparent sepia | |

EXAMPLE 22

The following formulation was applied to a glass plate of the type used in the foregoing examples, by spraying through a fine spray nozzle heated to a temperature of 115°.

| | |
|---|---|
| HCHO-cyclohexanone condensation polymer (Mohawk MR-85) | 2.9% |
| dioxane | 29.8 |
| ethanol | 46.5 |
| gamma-butyrolactone | 11.8 |
| m-hydroxyphenylurea | 2.3 |
| 4-(N-pyrrolidinyl)-m-toluene-diazonium hexafluoroarsenate | 6.7 |

After drying as in Example 1, the residual layer had a thickness of one micron. When exposed and developed as in the preceding examples, a transparent sepia image was produced, with excellent resolution.

EXAMPLE 23

Mask-yielding photosensitized plates prepared in accordance with Examples 1 through 14 inclusive were coated— after the light-sensitive layer was dried—by applying 0.85- 3.0 ml. of a 1:1 solution in xylene of (a) Spenkel polyurethane resin M21–40X, (b) Spenkel polyurethane resin F48-50X, and (c) a mixture of 63 percent liquid ricinoleate polyester diisocyanate prepolymer and 34 percent hardener ("Vorite" prepolymer 63 and "Polycin" Polyol 807—Baker Castor Oil Company). After evaporation of the solvent, there remained a protective layer of polyurethane about 0.8 micron thick. The protective layers were cured at least 24 hours before use of the light-sensitive materials. The surface layers thereby produced provided a tough wear-resistant surface for purposes of contact exposure, of such transparency as to avoid any interference with the operation of the light-sensitive plates. An optional toughening step involves a 5–20 minute bake at a temperature of 85°–100° after the mask has been exposed and developed.

Variations and modifications which will be obvious to those skilled in the art may be made in the foregoing examples without departing from the spirit and purview of this invention and the scope of the appended claims. For example, although this invention yields its major advantages in the microelectronic field, it may obviously be employed in fields not requiring such high resolution capabilities, e.g., wherein the lines or areas in the azo dye image and/or non-azo dye-image areas range up to 10 microns, 100 microns, etc. or more in width.

We claim:

1. A non-silver halide photographic mask, suitable for use in the manufacture of a microelectronic component or device, said mask comprising a flat, rigid, dimensionally stable transparent base, a thin transparent resin layer of uniform thickness adhering to a surface of said base, and an azo dye image of said pattern, the dyestuff of which image is molecularly dispersed in the image areas of said resin layer and uniformly distributed throughout the thickness of said layer, said azo dye image being opaque to ultraviolet light but transparent to visible light, and the non-azo dye-image areas of said layer being transparent to both ultraviolet and visible light.

2. A photographic mask as defined in claim 1, wherein said resin layer has a thickness of 0.5 – 10 microns.

3. A photographic mask as defined in claim 2, wherein the concentration of the azo dye in the image areas of said resin layer amounts to at least about 10 percent by weight of such areas.

4. A photographic mask as defined in claim 2, wherein the concentration of the azo dye in the image areas of said resin layer amounts to 30 – 90 percent by weight of such areas.

5. A photographic mask as defined in claim 1, wherein said azo dye image includes lines in the range of from 0.1 to 100 microns in width.

6. A photographic mask as defined in claim 1, wherein said azo dye image includes lines in the range of from 0.1 to 1.0 microns in width.

7. A photographic mask as defined in claim 1, wherein the non-azo dye-image areas include lines in the range of from 0.1 to 100 microns in width.

8. A photographic mask as defined in claim 1, wherein the non-azo dye-image areas include lines in the range of from 0.1 to 1.0 micron in width.

9. A photographic mask as defined in claim 1, wherein the surface of said image-bearing resin layer is coated with an adherent, wear-resistant layer of a transparent resin of uniform thickness of 0.1 to 5 microns.

* * * * *

UNITED STATES PATENT AND TRADEMARK OFFICE

Certificate

Patent No. 3,744,904 Patented July 10, 1973

Frank J. Loprest and Donald E. Barr

Application having been made by Frank J. Loprest and Donald E. Barr the inventors named in the patent above identified and GAF Corporation, New York, N.Y., a corporation of Delaware, the assignee, for the issuance of a certificate under the provisions of Title 35, Section 256, of the United States Code, deleting the name of Donald E. Barr as a joint inventor, and a showing and proof of facts satisfying the requirements of the said section having been submitted, it is this 30th day of September 1975, certified that the name of the said Donald E. Barr is hereby deleted from the said patent as a joint inventor with the said Frank J. Loprest.

FRED W. SHERLING,
*Associate Solicitor.*

Disclaimer 3,744,904.—*Frank J. Loprest,* Binghamton, N.Y TRANSPARENT PHOTOGRAPHIC MASKS. Patent dated July 10, 1973. Disclaimer filed Sept. 30, 1982, by the assignee, *Eastman Kodak Co.*

Hereby enters this disclaimer to all claims of said patent.

[*Official Gazette April 5, 1983.*]